United States Patent
Vogelsang (10) Patent No.: US 7,440,347 B1
(45) Date of Patent: Oct. 21, 2008

(54) CIRCUIT AND METHOD TO FIND WORDLINE-BITLINE SHORTS IN A DRAM

(75) Inventor: Thomas Vogelsang, Jericho, VT (US)

(73) Assignee: Qimonda North America Corp., Cary, NC (US)

( * ) Notice: Subject to any disclaimer, the term of this patent is extended or adjusted under 35 U.S.C. 154(b) by 0 days.

(21) Appl. No.: 11/744,790

(22) Filed: May 4, 2007

(51) Int. Cl.
*G11C 29/00* (2006.01)
(52) U.S. Cl. .................. 365/201; 365/149; 365/200
(58) Field of Classification Search .............. None
See application file for complete search history.

(56) References Cited

U.S. PATENT DOCUMENTS

| | | | |
|---|---|---|---|
| 5,343,431 A * | 8/1994 | Ohtsuka et al. | 365/201 |
| 5,606,527 A * | 2/1997 | Kwack et al. | 365/201 |
| 5,748,545 A * | 5/1998 | Lee et al. | 365/201 |
| 6,781,902 B2 * | 8/2004 | Oumiya et al. | 365/201 |
| 2007/0153596 A1 * | 7/2007 | Kilian et al. | 365/201 |

* cited by examiner

*Primary Examiner*—Tan T. Nguyen
(74) *Attorney, Agent, or Firm*—Patterson & Sheridan, L.L.P.

(57) ABSTRACT

Method and apparatus for testing for a short between a wordline being tested and a bitline in a memory device. The method includes applying a first voltage to the bitline using a first voltage source and applying a second voltage to the wordline being tested using a second voltage source. The method further includes disconnecting the wordline being tested from the second voltage source; and after disconnecting the wordline being tested from the second voltage source, activating the wordline being tested, thereby connecting the wordline being tested to a wordline power supply line. A determination is made of whether a voltage of the wordline power supply line indicates a short between the wordline being tested and the bitline. The determination is based on the voltage of the wordline power supply line relative to the first voltage and the second voltage.

29 Claims, 8 Drawing Sheets

CIRCUIT AND METHOD TO FIND WORDLINE-BITLINE SHORTS IN A DRAM

CROSS-REFERENCE TO RELATED APPLICATIONS

This application is related to U.S. patent application Ser. No. 11/240,981, filed Sep. 29, 2005, by Martin Versen et al., published as US2007/0070745A1, entitled REDUNDANT WORDLINE DEACTIVATION SCHEME. This related patent application is herein incorporated by reference in its entirety.

BACKGROUND OF THE INVENTION

Many modern electronic devices contain digital memory (e.g., a dynamic random access memory, DRAM). Each memory may be used to store information for a digital device. Users of such electronic devices typically desire large amounts of memory in a small package. Where the electronic devices are portable (e.g., battery powered), users may also desire electronic devices which do not consume as much power and therefore have a longer battery life. Thus, manufacturers of electronic devices typically desire small, high density memories with low power consumption.

To meet the demand for small, high density memories, memory manufacturers typically create memory chips with the smallest available features (e.g., transistors and control lines) and with densely packed memory cells. However, as the size of features in a memory chip shrinks and as the memory density of a memory chip increases, errors in the manufacturing process may cause more defective memories at a high cost to the manufacturer.

An example of a possible defect in a memory device is a short (e.g., an unintended electrical connection) between a defective wordline and a bitline of a memory device. Wordlines and bitlines are lines in a memory device which are used to access a memory cell (e.g., at the junction of the wordline and bitline) in the memory device. Where a wordline and bitline are shorted, the memory cell located at the junction of the wordline and bitline may, in some cases, not be accessible, thereby resulting in a defective memory cell and defective memory device.

To reduce the number of defective memory devices resulting from defective wordlines and/or bitlines, many manufacturers create memory devices with redundant wordlines and/or bitlines. Where, for example, the manufacturer detects a defective wordline, the memory device may use a redundant wordline instead of the defective wordline. When a memory device uses a redundant wordline instead of a defective wordline, the defective wordline may be referred to as a repaired wordline.

While repairing a defective wordline may prevent a memory device from losing data, the defective wordline may still remain shorted to a bitline. In some cases, where a defective wordline is shorted to a bitline, current may flow between the defective wordline and the bitline, thereby increasing the power consumption of the memory device. Therefore, there is a need to not only repair the defective wordline, but also to reduce the power consumption of the memory device due to the defective wordline.

Further, it is generally desirable to perform repair operations quickly in order to reduce the amount of time used for testing a memory device, thereby reducing the overall cost of the memory device. Furthermore, to maintain a low overall cost of the memory device, there may be a desire to locate defective wordlines without increasing the complexity of the test method and/or memory device.

Accordingly, what is needed is an improved method and apparatus for locating and repairing defective wordlines.

SUMMARY OF THE INVENTION

Embodiments of the invention generally provide a method and apparatus for testing for a short between a wordline being tested and a bitline in a memory device. The method includes applying a first voltage to the bitline using a first voltage source and applying a second voltage to the wordline being tested using a second voltage source. The method further includes disconnecting the wordline being tested from the second voltage source; and after disconnecting the wordline being tested from the second voltage source, activating the wordline being tested, thereby connecting the wordline being tested to a wordline power supply line. A determination is made of whether a voltage of the wordline power supply line indicates a short between the wordline being tested and the bitline. The determination is based on the voltage of the wordline power supply line relative to the first voltage and the second voltage.

One embodiment of the invention provides a dynamic, random access memory device, including a wordline, a wordline power supply line, a bitline, and circuitry configured to perform a test operation for a short between the wordline and the bitline. During the test operation, the circuitry is configured to apply a first voltage to the bitline using a first voltage source and apply a second voltage to the wordline using a second voltage source. The circuitry is also configured to disconnect the wordline from the second voltage source and after disconnecting the wordline from the second voltage source, activate the wordline, thereby connecting the wordline being rested to the wordline power supply line. The circuitry is further configured to determine whether a voltage of the wordline power supply line indicates a short between the wordline and the bitline. The determining is based on the voltage of the wordline power supply line relative to the first voltage and the second voltage.

One embodiment of the invention also provides a method for testing for a short between a wordline being tested and a bitline in a memory device. The method includes applying a first bitline voltage to the bitline using a first voltage source and a wordline off voltage to the wordline being tested using a second voltage source. The method also includes applying a precharge voltage to a wordline power supply line using a third voltage source. The method further includes disconnecting the wordline being tested from the second voltage source and disconnecting the wordline power supply line from the third voltage source. After disconnecting the wordline being tested from the second voltage source and disconnecting the wordline power supply line from the third voltage source, the wordline being tested is connected to the wordline power supply line and a determination is made of whether a voltage of the wordline power supply line indicates a short between the wordline being tested and the bitline. The determining is based on the voltage of the wordline power supply line relative to the first bitline voltage and the wordline off voltage.

One embodiment of the invention further provides a dynamic, random access memory device including a wordline, a wordline power supply line which is connectible to the wordline, a bitline, and circuitry configured to perform a test operation for a short between the wordline and the bitline. During the test operation, the circuitry is configured to apply a first bitline voltage to the bitline using a first voltage source and apply a wordline off voltage to the wordline using a second voltage source. The circuitry is also configured to apply a precharge voltage to the wordline power supply line using a third voltage source, disconnect the wordline from the second voltage source, and disconnect the wordline power supply line from the third voltage source. After disconnecting the wordline from the second voltage source and disconnecting the wordline power supply line from the third voltage source, the circuitry is configured to connect the wordline to the wordline power supply line and determine whether a voltage of the wordline power supply line indicates a short between the wordline and the bitline. The determining is based on the voltage of the wordline power supply line relative to the first bitline voltage and the wordline off voltage.

Another embodiment of the invention provides a dynamic, random access memory device including a wordline, a bitline, a wordline power supply line, and power supply connection circuitry configured to connect the wordline power supply line to at least one of a precharge voltage and a wordline activation voltage. The memory device also includes wordline connection circuitry configured to connect and disconnect the wordline from the wordline power supply line and control circuitry configured to perform a test operation for a short between the wordline and the bitline. During the test operation, the control circuitry is configured to apply a first bitline voltage to the bitline using a first voltage source and apply a wordline off voltage to the wordline using a wordline off voltage source. The control circuitry is also configured to apply the precharge voltage to the wordline power supply line using the power supply connection circuitry, disconnect the wordline from the wordline off voltage source and disconnect the wordline power supply line from the precharge voltage using the power supply connection circuitry. The control circuitry is further configured to connect the wordline to the wordline power supply line using the wordline connection circuitry and after connecting the wordline to the wordline power supply line, determine whether a voltage of the wordline power supply line indicates a short between the wordline and the bitline. The determining is based on the voltage of the wordline power supply line relative to the first bitline voltage and the wordline off voltage.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Embodiments of the invention generally provide a method and apparatus for testing for a short between a wordline being tested and a bitline in a memory device. The method includes applying a first voltage to the bitline using a first voltage source and applying a second voltage to the wordline being tested using a second voltage source. The method further includes disconnecting the wordline being tested from the second voltage source; and after disconnecting the wordline being tested from the second voltage source, activating the wordline being tested, thereby connecting the wordline being tested to a wordline power supply line. A determination is made of whether a voltage of the wordline power supply line indicates a short between the wordline being tested and the bitline. The determination is based on the voltage of the wordline power supply line relative to the first voltage and the second voltage.

While described below with respect to wordlines in a memory array of a memory device, embodiments of the invention may be used in a memory device containing multiple memory arrays. Embodiments may be utilized in memory devices with a segmented wordline architecture (e.g., where a main wordline is used to access a local wordline, also referred to as a hierarchical wordline architecture). Where the segmented wordline architecture is implemented, the term "wordline" used alone may be used to refer to an individual local wordline. Embodiments may also be utilized in memory devices with a stitched wordline architecture, for example, where a polysilicon wordline is electrically connected at multiple points ("stitched") by stitches (electrical connections, sometimes referred to as straps) to a layer of low resistance metal.

Signal names used below are exemplary names, indicative of signal levels used to perform various functions in a given memory device. In some cases, the relative level of such signals may vary from device to device. Furthermore, the circuits and devices described below and depicted in the figures are merely exemplary of embodiments of the invention. As recognized by those of ordinary skill in the art, embodiments of the invention may be utilized with any memory device containing defective wordlines.

An Exemplary Memory Device

Figure 1A:
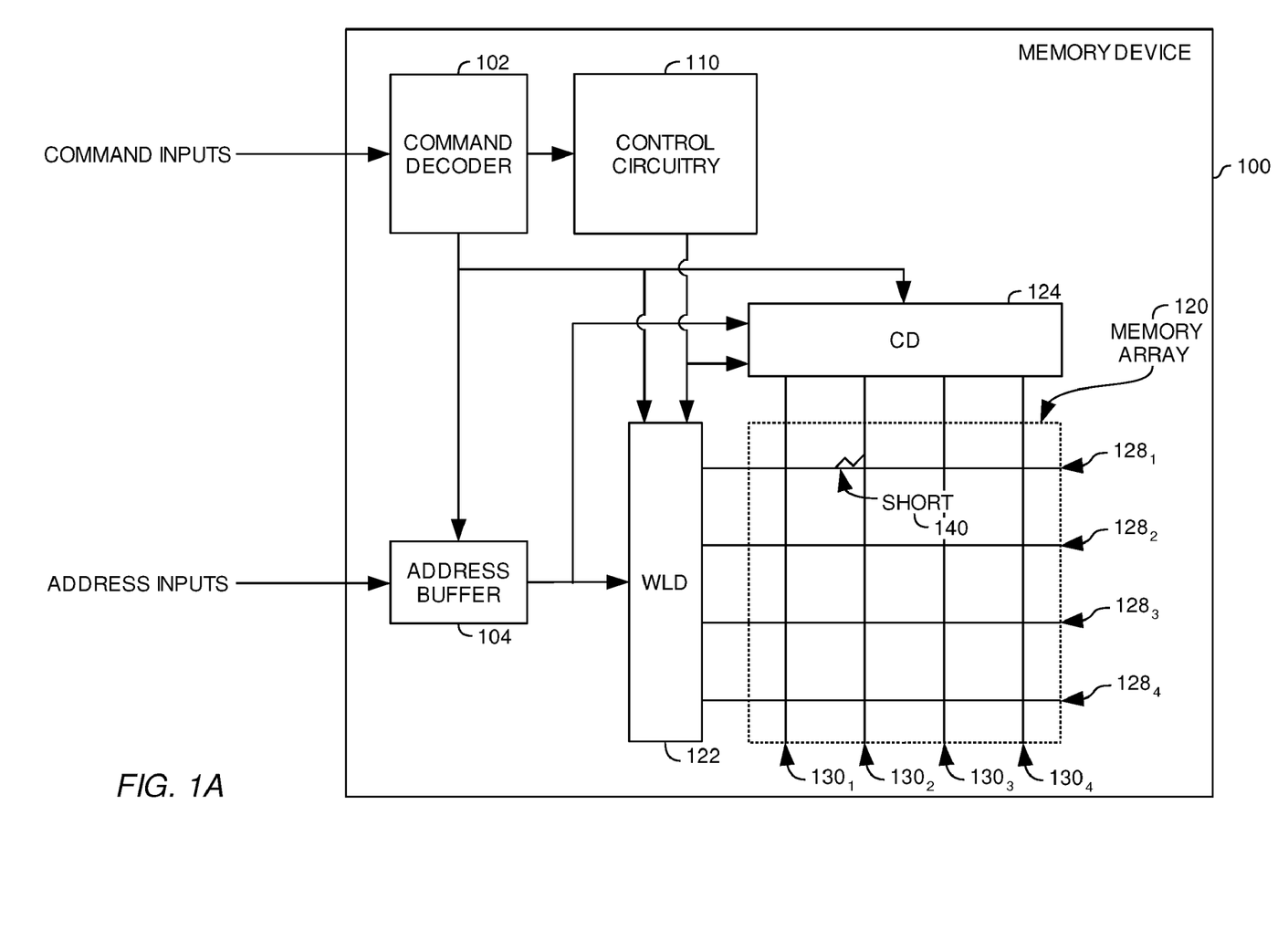
FIGS. 1A-B are block diagrams depicting aspects of a memory device according to one embodiment of the invention.

FIG. 1A is a block diagram depicting a memory device 100 according to one embodiment of the invention. The memory device 100 may include address inputs and command inputs. The address inputs may be received by an address buffer 104 and the command inputs may be receive by a command decoder 102. The address inputs may be used by a wordline decoder 122 and column decoder 124 to access memory cells in a memory array 120. In some cases, multiple memory arrays 120 may be accessed using one or more wordline decoders 122 and column decoders 124.

In one embodiment, the column decoder 124 may select bitlines 130 of the memory array 120 to be accessed. Similarly, the wordline decoder 122 may select wordlines 128 to be accessed. In some cases, access may occur based on an address received by the memory device 100 from an external source. Optionally, the access may occur based on an address which is internally generated. Other circuitry such as sense amps, output buffers, data strobe circuits, etc. (not depicted) may also be used to access and output data from the memory array 120.

The memory array 120 typically contains a plurality of memory cells. Each memory cell may be located at the intersection of a wordline 128 and a bitline 130 and may be used to store a bit of information for the memory device 100. In some cases, when a given row of memory cells in the memory array 120 is accessed (e.g., by a read, write, or refresh), a wordline 128 in the memory array 120 corresponding to a given address may be activated. In some cases, the activation may be initiated by an explicit command (ACT) issued to the memory device 100. After the wordline 128 has been activated and the memory cells have been accessed, bitlines 130 in the memory array 120 may be precharged. In some cases, the precharge may also be initiated by an explicit command (PRE) issued to the memory device 100. Activating and precharging are described in greater detail below.

When a memory address is activated, a wordline driver for a wordline 128 corresponding to the accessed address may drive the wordline 128 to a high voltage (referred to as the wordline on voltage, VWLON). When the wordline 128 is driven to VWLON, one or more access transistors located at the intersection of the wordline 128 and a bitline 130 may be activated (e.g., turned on), thereby allowing memory cells located at the intersection of the wordlines 128 and bitlines 130 to be accessed.

In one embodiment, after a wordline 128 in the memory array 120 has been activated, bitlines 130 in the memory array 120 may be precharged. When the precharge is initiated, each wordline 128 in the memory array 120 may be lowered to the low wordline voltage VNWLL, thereby electrically disconnecting the bitlines 130 from the memory cells in the memory array 120. As described above, when the bitlines 130 are disconnected from the memory cells, the bitlines 130 may be driven to a voltage (VBLEQ) which is midway between the voltage corresponding to a bitline high logic level (VBLH) and the voltage corresponding to a bitline low logic level (VBLL), such as (VBLH+VBLL)/2. By precharging the bitlines 130 to VBLEQ, during a subsequent operation when the values stored in the memory cells are sensed using the bitlines 130, a smaller voltage swing may be necessary to drive the bitlines 130 to the voltage corresponding to the stored logic value (e.g., VBLH for a stored high logic level or VBLL for a stored low logic level) and thereby sense the value stored in the memory cells. VBLEQ may also be intermediate (or approximately intermediate) between the wordline on voltage VWLON and the wordline off voltage VNWLL.

As mentioned above, in some cases, the memory device 100 may have a defect such as, for example, a short 140 between a wordline $128_1$ and bitline $130_2$. To prevent such a defect from rendering a memory device 100 defective, the memory device 100 may contain circuitry used to repair defective wordlines as described below.

Figure 1B:
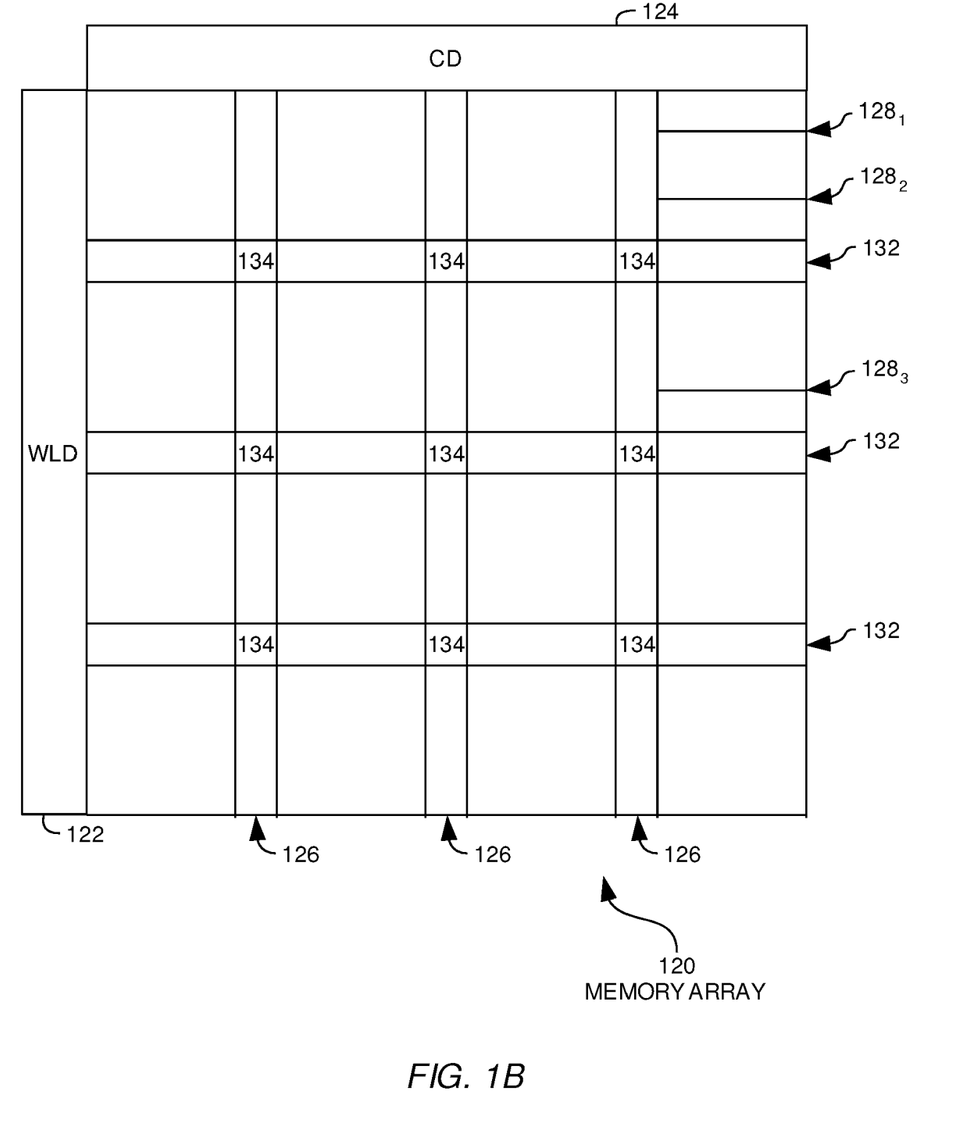

FIG. 1B is a block diagram depicting an arrangement of a memory array 120 according to one embodiment of the invention. The array 120 may be arranged into a plurality of blocks. Where a segmented memory architecture is implemented, each block may include multiple segments, with each segment including a plurality of local wordlines 128. During wordline selection, the wordline decoder 122 may select a main wordline and the column decoder 124 may select a column containing a segment to be accessed. Local wordline selection signals may be provided via local wordline signal paths 126 to local wordline decoder circuitry (also referred to as centrons) 134 which may be used to select a local wordline 128. The local wordline 128 identified by the main wordline selection, column selection, and the local wordline selection may then be accessed, for example, using a segment driver located in the local wordline signal paths 126. During a read access, data accessed via the selected local wordline 128 may be provided via corresponding bitlines 130 to sense amps in a sense amp stripe 132.

Figure 2:
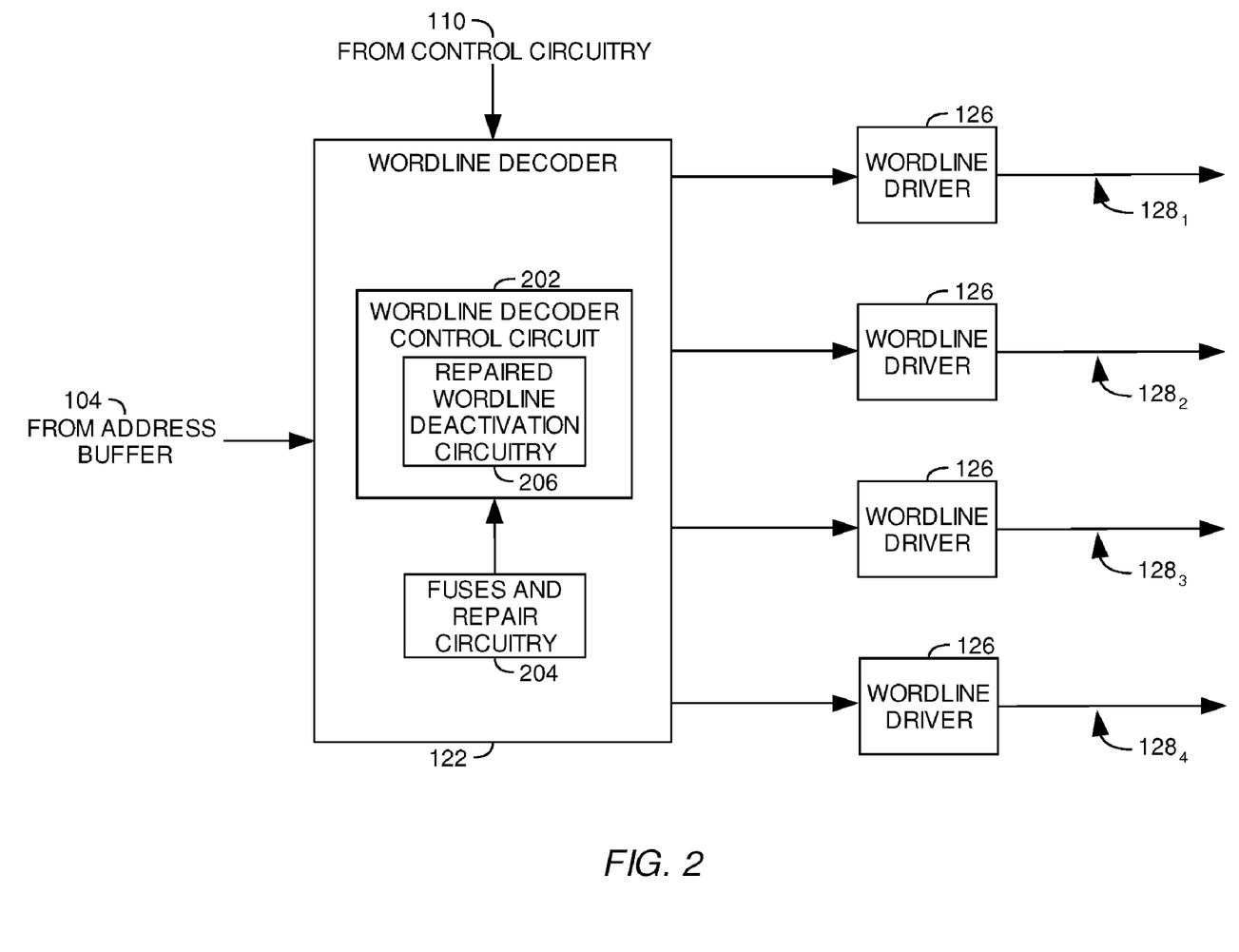
FIG. 2 is a block diagram depicting a wordline decoder circuit according to one embodiment of the invention.

In one embodiment, the wordlines 128 in each block may be accessed using a wordline decoder control circuit 202 as depicted in FIG. 2. For example, the wordline decoder control circuit 202 may receive address data from the address buffer 104 and control information from the control circuit 110 which may be used to access the appropriate wordline. A defective wordline 128 in a block may be detected by testing the memory device 100. Testing methods are described below in greater detail. To prevent a defective wordline $128_1$ from rendering a memory device 100 defective, the memory device 100 may contain circuitry used to replace the defective wordline $128_1$ with another wordline (e.g., wordline $128_3$) in the memory device 100. A wordline used to replace a defective wordline $128_1$ may be referred to as a redundant wordline $128_3$. Other wordlines which are not defective and are not redundant wordlines (e.g., wordline $128_2$) may be referred to as good wordlines.

When a defective wordline $128_1$ is detected, fuses and repair circuitry 204 may be used to replace the defective wordline $128_1$ with a redundant wordline $128_3$. Optionally, in a segmented wordline architecture, where a given segment contains a defective local wordline, the entire segment may be replaced with another redundant segment which may be accessed via a redundant main wordline. The fuses and repair circuitry 204 may record one or more addresses of the defective wordlines $128_1$, for example, by electronically programming one or more fuses. The fuses and repair circuitry 204 may also be used to record the location of one or more redundant wordlines $128_3$ to be used instead of the defective wordline(s) $128_1$. Information about defective and redundant wordlines may also be stored in types of nonvolatile memory other than fuses such as flash memory and/or electrically programmable read-only memory (EPROM).

After the fuses and repair circuitry 204 have been programmed with the test results, the fuses and repair circuitry 204 may be used to detect an attempt to access the defective wordline $128_1$. For example, when the memory device 100 is powered on, the recorded address may be read from the fuses and repair circuitry 204 by the wordline control circuit 202 and/or other control circuits in the wordline decoder 122. When the wordline decoder 122 receives a request to access a given address, the wordline decoder 122 may compare the requested address to one or more recorded addresses which correspond to defective wordlines $128_1$.

If the wordline decoder 122 detects an access to the recorded address corresponding to the defective wordline $128_1$, the redundant wordline $128_3$ may be accessed instead. For example, the redundant wordline $128_3$ may be driven to a wordline on voltage (VWLON) while any and all defective wordlines (e.g., wordline $128_1$) in a given block 126 may be driven to the wordline off voltage VNWLL, thereby accessing memory cells controlled by the redundant wordline $128_3$ instead of the defective wordline $128_1$. By driving any and all defective wordlines in a given block 126 to the wordline off voltage VNWLL, additional capacitance that would be connected to the bitlines 130 (e.g., due to memory cells accessed by the defective wordlines) may be reduced (e.g., by disabling the access transistors for those memory cells), thereby increasing the signal margin for bitlines 130 in the block 126. Also, by accessing the redundant wordline $128_3$ instead of the defective wordline $128_1$, the memory device may properly access data located at the recorded address. Where a defective wordline $128_1$ is properly replaced by a redundant wordline $128_3$, the defective wordline $128_1$ may also be referred to as a repaired wordline $128_1$ (or a defective and repaired wordline $128_1$).

Thus, the defective wordline $128_1$ may be repaired and the redundant wordline $128_3$ may be used instead of the repaired wordline $128_1$, thereby preventing the memory device 100 from being defective. However, during precharge, current may flow from the repaired wordline $128_1$, which is held at VNWLL to the bitline $130_2$, which is held at VBLEQ, through short 140, thereby consuming power. According to one embodiment of the invention, power consumption in a defective and repaired wordline $128_1$ may be reduced or eliminated by using deactivation circuitry 206 to change the repaired wordline voltage to VBLEQ during precharge.

Detecting and Repairing Defective Wordlines

Figure 3A:
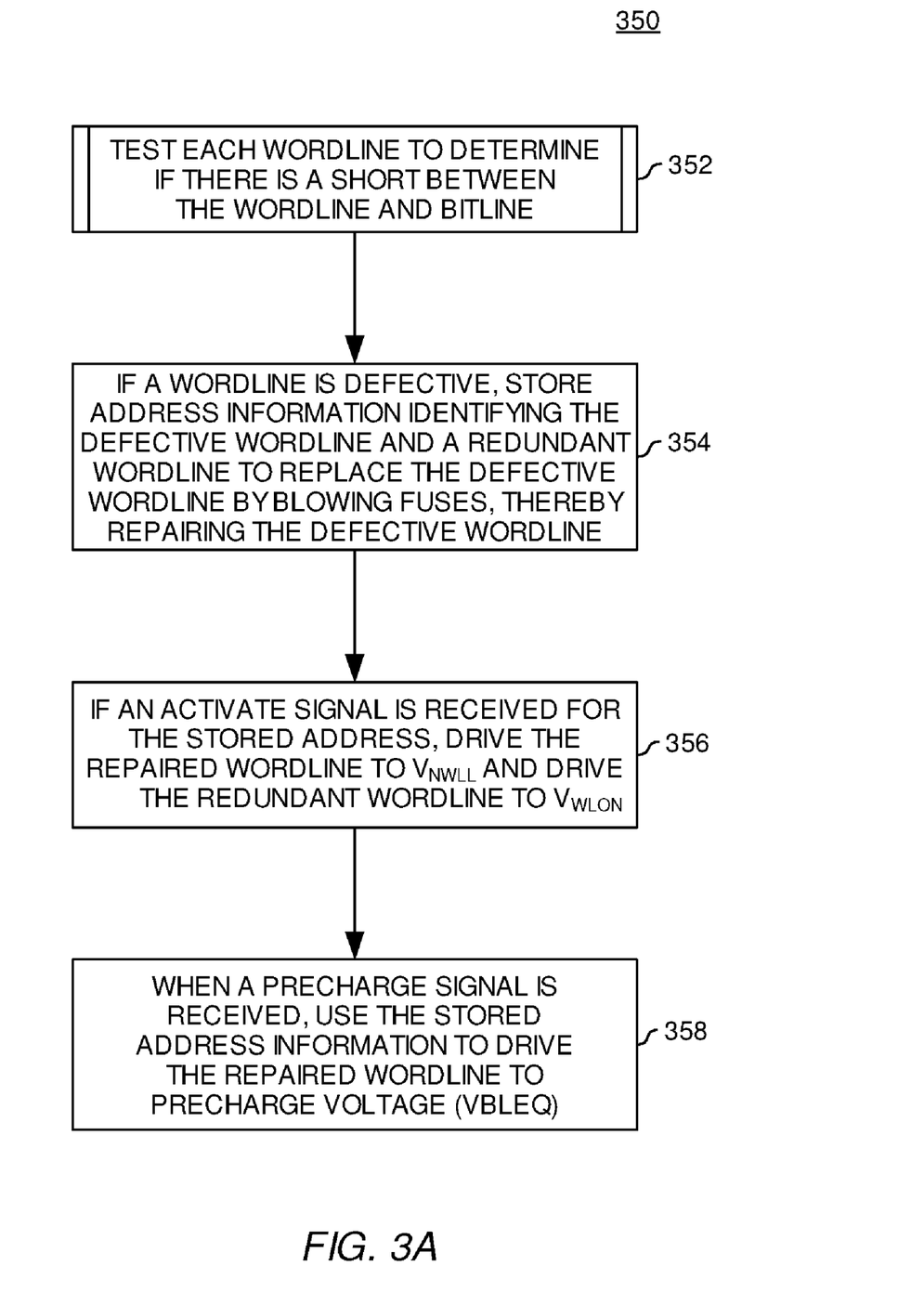
FIGS. 3A-D are flow diagrams and timing diagrams depicting processes for testing and operating a memory device according to one embodiment of the invention.

FIG. 3A illustrates operations 350 for testing for and reducing the power consumption of a memory device 100 due to a defective wordline $128_1$ according to one embodiment of the invention. The process 350 may begin at step 352 where each wordline 128 in the memory device 100 is tested to determine if there is a short between the wordline 128 and a bitline 130. Testing of individual wordlines 128 is described in greater detail below with respect to FIG. 3B.

At step 354, if a wordline (e.g., wordline $128_1$) is defective, address information identifying the defective wordline and a redundant wordline (e.g., wordline $128_3$) to replace the defective wordline may be stored, for example, by blowing one or more fuses in the fuses and repair circuitry 204. In some cases, the fuses may be electronically programmable fuses. Optionally, the fuses may be laser cut fuses or the address information may be stored in nonvolatile memory, such as, for example, a flash memory.

At step 356, if an activate signal is received indicating that the wordline located at the stored address is being activated, the repaired wordline may be driven to the low wordline voltage VNWLL and the redundant wordline may be driven to the wordline on voltage VWLON. In one embodiment, the wordline decoder control circuit 202 may use the information stored in the fuses and repair circuitry 204 to determine when the stored address is being accessed and to determine which wordline to activate. Thus, as described above, information located at the stored address may be successfully accessed by using the redundant wordline $128_3$ instead of the repaired wordline $128_1$.

Then, at step 358, when a precharge signal is received, for example, indicating that the memory array 120 (or multiple memory banks) containing the defective wordline is being precharged, the stored address information may be used by repaired wordline deactivation circuitry 206 to drive the repaired wordline $128_1$ to the bitline equalized voltage, VBLEQ. By driving the repaired wordline voltage to VBLEQ, the repaired wordline $128_1$ and the bitline $130_2$ to which the repaired wordline $128_1$ is shorted may have voltage levels which are equal or approximately equal. Because the voltage levels are equal or approximately equal, there may be no voltage difference between the repaired wordline $128_1$ and the bitline $130_2$, and therefore no current between the repaired wordline $128_1$ and the bitline $130_2$. Thus, a leakage current from the repaired wordline $128_1$ to a bitline $130_2$ may be reduced or eliminated, thereby reducing power consumption of the memory device 100 during precharge. In one embodiment, as an alternative to applying VBLEQ to a repaired wordline $128_1$ during precharge, the wordline $128_1$ may be disconnected from any voltage sources (e.g., the wordline $128_1$ may be floated) to reduce or prevent any leakage current from flowing from the repaired wordline $128_1$ to a bitline $130_2$ during precharge, thereby reducing power consumption.

In one embodiment of the invention, a short between a wordline 128 and a bitline 130 may be tested by applying a first voltage to the bitline 130 using a first voltage source and applying a second voltage to the wordline 128 being tested using a second voltage source. The wordline 128 being tested may be disconnected from the second voltage source. If the wordline 128 is shorted to the bitline 130, then after disconnecting the wordline 128 from the second voltage source, the voltage of the wordline 128 may drift towards the voltage of the bitline 130 (the first voltage) because of charge sharing via the short. If, in contrast, the wordline 128 is not shorted to the bitline 130, then after disconnecting the wordline 128 from the second voltage source, the voltage of the wordline 128 may be isolated from the voltage of the bitline 130. Thus, where there is no short, the voltage of the wordline 128 may remain nearer to the second voltage.

As described above, the voltage of the wordline 128 being tested may indicate whether the wordline is shorted to the bitline 130. In one embodiment, the voltage of the wordline 128 being tested may be measured using a wordline power supply line. During normal operation, the wordline power supply line may be used to provide an activation voltage to the wordline 128. However, during the test operation, the wordline power supply line may be precharged to a precharge voltage (e.g., a ground voltage GND or the bitline equalized voltage VBLEQ) and connected to the wordline 128. If the wordline 128 is shorted to a bitline 130, then the wordline power supply line voltage may move from the precharge voltage towards the first voltage of the bitline 130. If the wordline 128 is not shorted to the bitline 130, then the voltage of the wordline power supply line may move from the precharge voltage towards the second voltage of the wordline 128. By testing individual wordlines 128 via a wordline power supply line, any test circuitry (e.g., comparison circuitry for determining the voltage of the wordline power supply line) connected to the wordline power supply line may be shared by each of the wordlines connected thereto, thereby reducing the amount of overhead dedicated to the test circuitry.

Figure 3B:
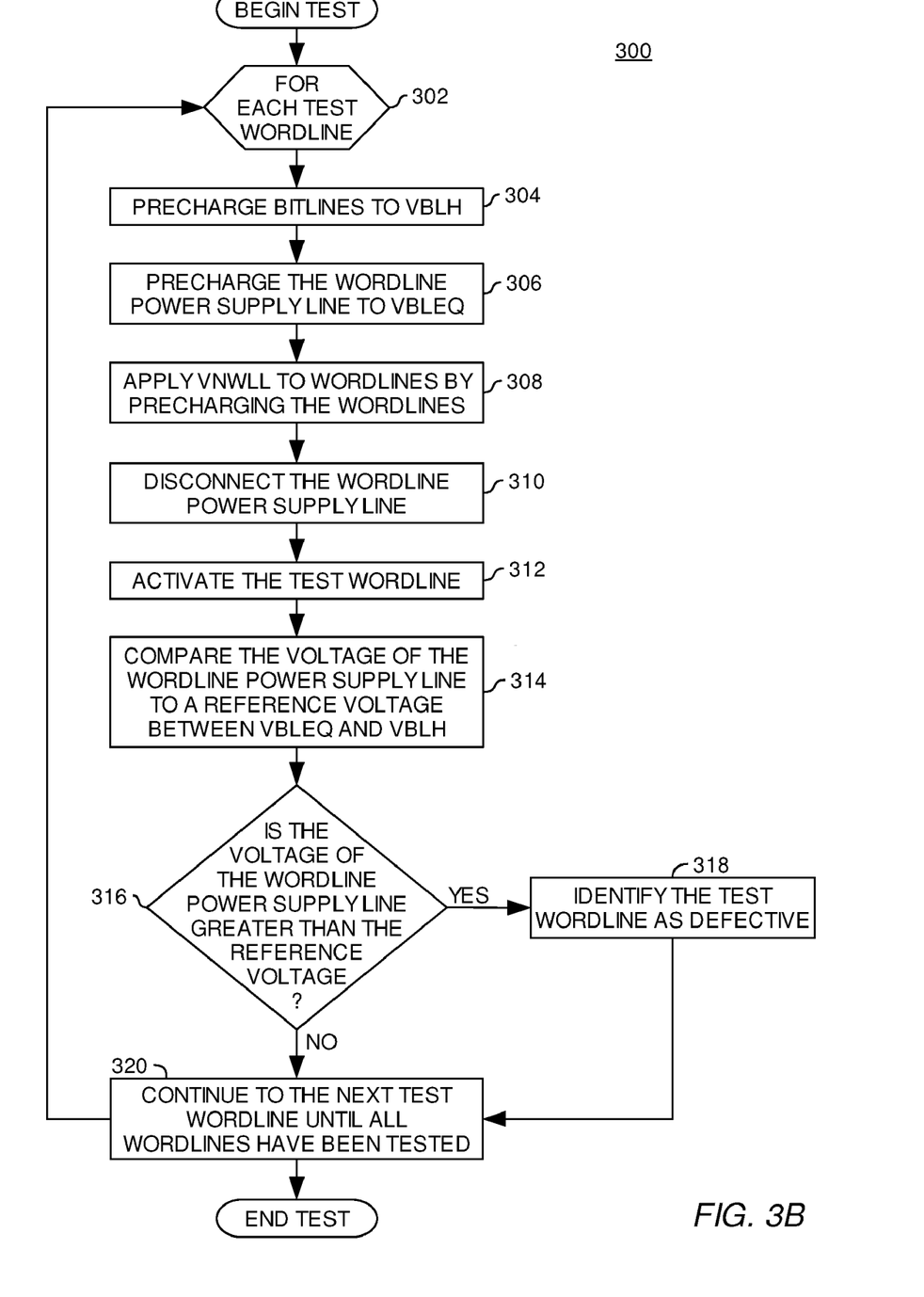
Figure 3C:
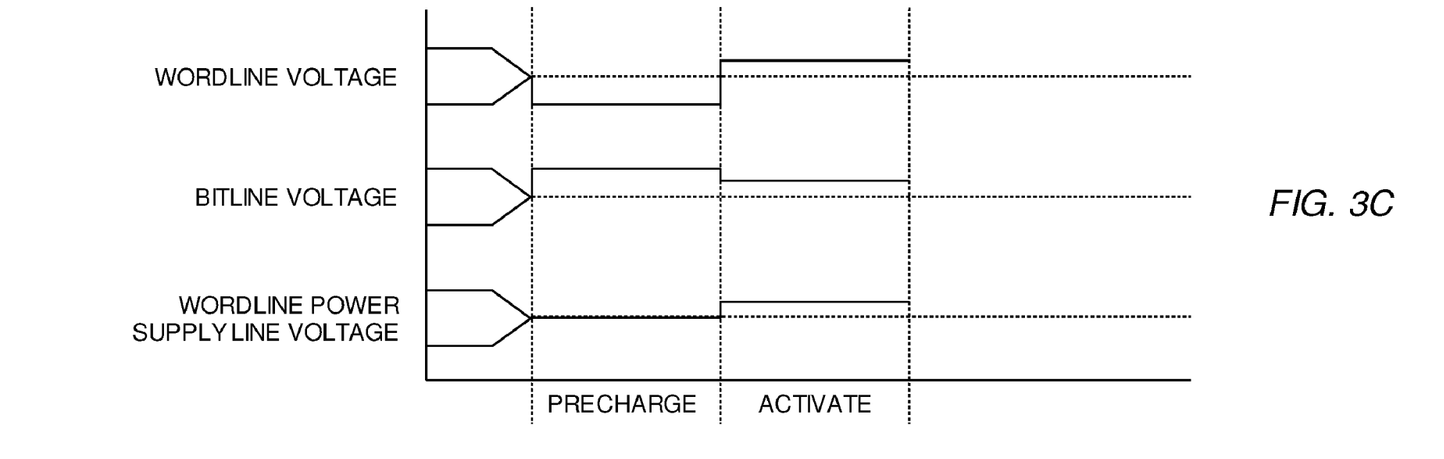

FIG. 3C is a timing diagram depicting an exemplary test operation for a wordline 128 and a bitline 130 which are shorted according to one embodiment of the invention. As depicted, during a precharge portion of the test, a low voltage may be applied to the wordline 128, a high voltage may be applied to the bitline 130, and a precharge voltage may be applied to the wordline power supply line. Then, during an activate portion of the test, the wordline voltage may drift upwards towards the high voltage of the bitline 130 due to charge sharing between the wordline 128 and bitline via the short 130. The wordline power supply line which is connected to the wordline 128 during the activate portion of the test, may also be pulled upwards from the precharge voltage towards the voltage of the bitline 130. By measuring the voltage of the wordline power supply line, the short between the bitline 130 and wordline 128 may be easily detected.

Figure 3D:
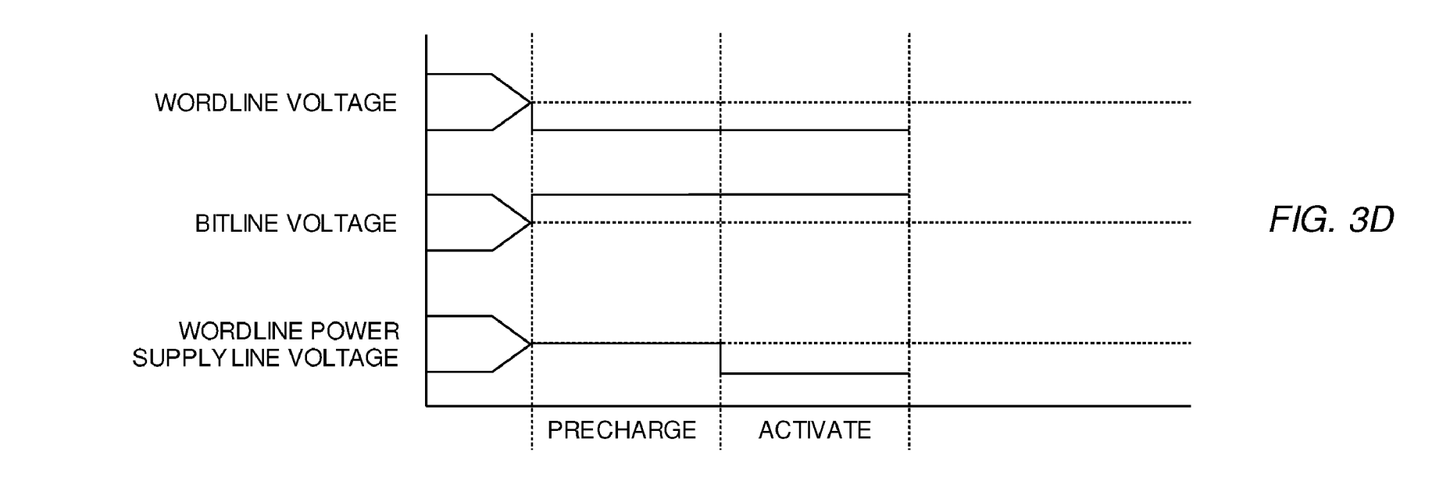

FIG. 3D is a timing diagram depicting an exemplary test operation for a wordline 128 and a bitline 130 which are not shorted according to one embodiment of the invention. As depicted, during the precharge portion of the test, a low voltage may be applied to the wordline 128, a high voltage may be applied to the bitline 130, and a precharge voltage may be applied to the wordline power supply line. Then, during the activate portion of the test, because the wordline voltage is isolated from the bitline voltage in the absence of a short, the wordline voltage may remain near the low voltage. The wordline power supply line which is connected to the wordline 128 during the activate portion of the test, may be pulled downwards from the precharge voltage towards the voltage of the wordline 128. When the voltage of the wordline power supply line is subsequently measured and found to be closer to the low voltage of the wordline 128, the test result may indicate that the wordline is not shorted to the bitline 130.

FIG. 3B is a flow diagram depicting a process 300 for testing for a short between a wordline 128 and a bitline 130 according to one embodiment of the invention. The process 300 begins at step 302 where the memory device 100 begins testing each wordline 128 in the memory array 120. In some cases, control circuitry 110 of the memory device 110 may perform the test, for example, after receiving an externally issued test command. Also, in one embodiment, an external tester, acting together with the memory device 100, may be used to perform the process 300. During the test, the bitlines 130 being tested may be precharged to the first voltage, in this case, the high bitline voltage VBLH, at step 304. Precharging of the bitlines 130 may be performed during the test, for example, by sense amps in the sense amp stripe 132.

At step 306, the wordline power supply line may be precharged to a precharge voltage, in this case, the bitline equalized voltage VBLEQ. As described above, by precharging the wordline power supply line to VBLEQ, any change in the voltage of the wordline 128 due to a short may be measured as a change in the wordline power supply voltage. At step 308, the wordline off voltage VNWLL may be applied to wordlines 128 in the memory array 120 by precharging the wordlines 128. At step 310, the wordline power supply line 310 may be disconnected from VBLEQ and allowed to float, and at step 312, the wordline 128 being tested may be activated, thereby connecting the wordline 128 and the wordline power supply line.

As described above, if the wordline 128 being tested is shorted to a bitline 130, then the voltage of the wordline 128 may be pulled upwards from the precharged voltage VNWLL of the wordline 128 towards the precharged voltage of the bitline 130, VBLH. Then, when the wordline 128 is activated and thereby connected to the wordline power supply line, the voltage of the wordline power supply line may be pulled upwards from VBLEQ towards VBLH. In contrast, if there is no short between the wordline 128 and a bitline 130, then the wordline 128 may remain at VNWLL and may pull the voltage of the wordline power supply line downwards from VBLEQ when the wordline 128 is activated.

Thus, to test whether there is a short between the wordline 128 and a bitline 130, after activating the wordline 128 at step 312, the voltage of the wordline power supply line may be compared to a third voltage (e.g., a reference voltage) between the precharge voltage VBLEQ and the bitline voltage VBLH. If a determination is made at step 316 that the voltage of the wordline power supply line is greater than the reference voltage, then the wordline 128 being tested may be identified as defective at step 318. At step 320, the test may continue to the next wordline 128 being tested until all wordlines 128 have been tested.

Figure 4A:
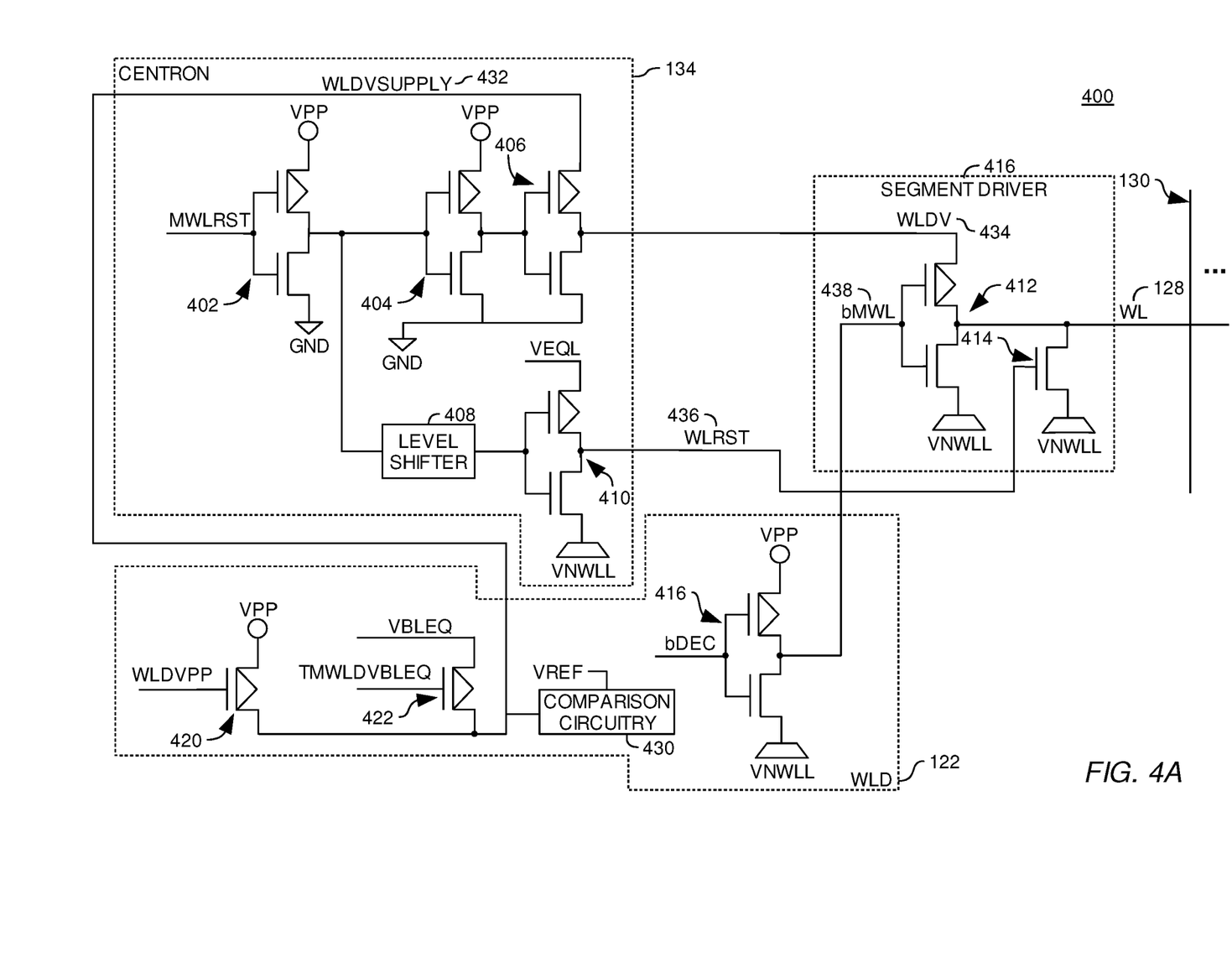
FIGS. 4A-B are block diagrams depicting wordline access circuitry according to embodiments of the invention.

FIG. 4A is a circuit diagram including circuitry 400 for testing for a short between a wordline 128 and a bitline 130 according to one embodiment of the invention. As depicted, the circuitry 400 may be included in the wordline decoder 122, local wordline decoder circuitry (also referred to as a centron) 134, and segment driver circuitry 416. In one embodiment, the segment driver circuitry may be included within the area of the local wordline signal paths 126.

During a precharge operation of a wordline 128, the wordline 128 may initially be precharged to the wordline off voltage VNWLL by asserting the main wordline reset (MWLRST) signal. When the main wordline reset signal is asserted, inverter 402 may provide a low voltage (GND) to a level shifter 408 which may provide a lowered voltage to inverter 410, thereby applying equalized voltage VEQL to transistor 414 via the wordline reset (WLRST) line 436 and driving the wordline 128 to the wordline off voltage VNWLL. After the wordline 128 has been precharged to VNWLL, the wordline reset signal MWLRST may be lowered.

As described above, during a test, the wordline power supply line (WLDVSUPPLY) 432 may be precharged to a precharge voltage such as the bitline equalized voltage VBLEQ (or, optionally, the ground voltage GND) and the bitlines 130 connected to the wordline 128 being tested may be precharged to the bitline high voltage VBLH. Power supply connection circuitry comprising transistors 420 and 422 may be used to change the voltage of the wordline power supply line 432 during the test. For example, during the test, a test mode signal (TMWLDVBLEQ) may be applied to transistor 422 to cause the transistor 422 to supply VBLEQ to the wordline power supply line 432. After the wordline power supply line 432 has been precharged to VBLEQ, the wordline power supply line 432 may be disconnected from VBLEQ by raising the test mode signal TMWLDVBLEQ.

To perform the test for a short between the wordline 128 and bitlines 130, the wordline 128 may be activated by raising the decoder signal bDEC applied to inverter 416, thereby lowering the voltage applied to the control line 438 for the main wordline signal (bMWL). When the voltage applied to control line 438 is lowered, inverter 412 may connect the wordline 128 to the local wordline driver (WLDV) line 434. At the same time, the main wordline reset (MWLRST) signal may be lowered, thereby causing wordline connection circuitry including inverters 402, 404, 406 to connect the wordline 128 to the precharged wordline power supply line 432 via the local wordline driver line 434. Comparison circuit 430 may then be used to compare the voltage of the wordline power supply line 432 to a reference voltage VREF. As described above, if there is a short between wordline 128 and a bitline 130, the comparison circuit 430 may detect the short as an increase in the wordline power supply line voltage from VBLEQ towards the bitline voltage VBLH. If, however, there is no short between the wordline 128 and a bitline 130, then the comparison circuit 430 may determine that the voltage of the wordline power supply line 432 has decreased towards the wordline off voltage VNWLL of the wordline 128, thereby verifying that the wordline 128 is not shorted to a bitline 130.

As described above with respect to FIG. 3A, if a determination is made that the wordline 128 is defective due to a short, the wordline may be replaced with a redundant wordline. Then, during normal operation of the memory device 100, to reduce power consumption caused by the short during precharge, the identified defective wordline 128 may be driven to the bitline equalized voltage VBLEQ during precharge. For example, during precharge, the wordline power supply line 432 for the defective wordline 128 may be precharged to VBLEQ by lowering the test mode signal TMWLDVBLEQ. The defective wordline 128 may then be connected to the wordline power supply line 432, such that the voltage of the defective wordline is changed to VBLEQ, thereby equalizing the voltage of the defective wordline 128 and the bitline 130 to which the wordline 128 is shorted. By equalizing the voltage between the wordline 128 and the bitline 130, power consumption due to the short may be reduced.

As another option for reducing power consumption of a defective wordline 128, instead of equalizing the voltage between the wordline 128 and the bitline 130 during precharge, the wordline 128 may be floated (e.g., electrically disconnected from any power sources). For example, the wordline 128 may be connected to the wordline power supply line 432 and both the wordline 128 and the wordline power supply line 432 may be floated by disconnecting the wordline power supply line 432 from any voltage sources using transistors 420, 422.

In one embodiment, the wordline power supply line 432 may be configured to provide the activation voltage VPP to the wordline 128. For example, where the wordline 128 is not defective, then during precharge the wordline 128 may be precharged to the wordline off voltage VNWLL using transistor 414. When the wordline 128 is activated, the activation voltage VPP may be applied to the wordline power supply line 432 via transistor 420 by lowering the WLDVPP signal. The activation voltage VPP may then be applied to the activated wordline 128 as appropriate.

Figure 4B:
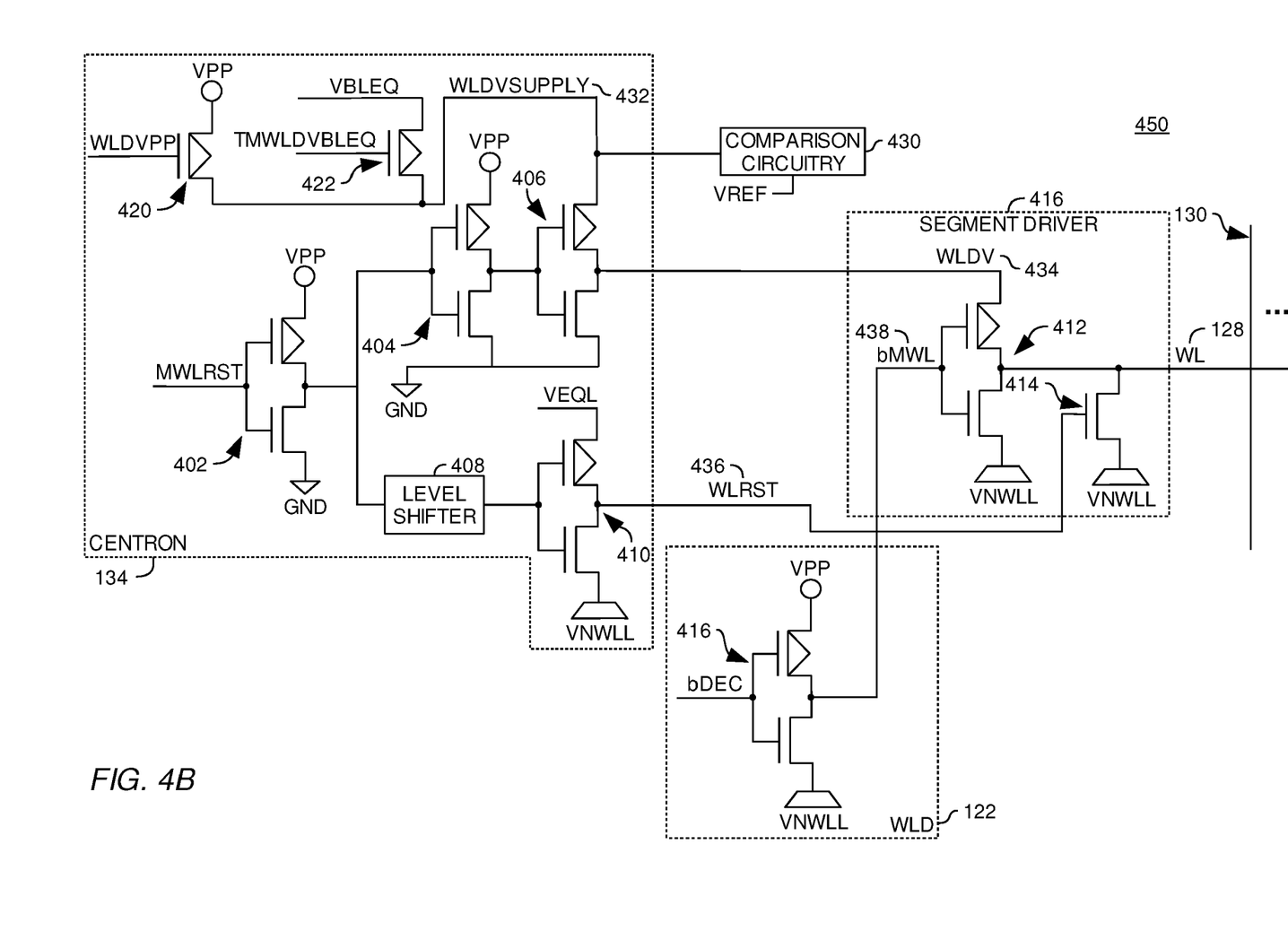

As depicted in FIG. 4A, in one embodiment, the power supply connection circuitry (transistors 420 and 422) for connecting the wordline power supply line 432 to the precharge voltage VBLEQ or the activation voltage VPP may be located with the wordline decoder circuitry 122. Thus, the selected voltage for the wordline power supply line 432 may be shared by an entire memory array 120, a bank of a memory array 120, and/or by a plurality of segments of a memory array 120. In another embodiment, as depicted in FIG. 4B, to provide more localized selection of the voltage for the wordline power supply line 432, the selection circuitry including transistors 420, 422 may be provided in the local wordline selection circuitry area 134.

Thus, in one embodiment, separate power supply connection circuitry 420, 422 may be provided for each wordline power supply line 432 for each segment of the memory device 100. By providing the power supply connection circuitry 420, 422 within the wordline selection circuitry area 134, control of the voltage for the wordline power supply line 432 may be localized. For example, during precharge, in segments which contain a defective wordline 128, the voltage of the wordline power supply line 432 may be changed to VBLEQ as described above. For segments which do not contain a defective wordline 128, the voltage of the wordline power supply line 432 may remain at the activation voltage VPP, thereby reducing power consumption due to switching the voltage of the wordline power supply line 432 in those segments.

In some cases, the wordline power supply line 432 may be shared by multiple wordlines 128 in a segment (or in a block, memory array 120, or other grouping of wordlines 128). Thus, during normal operation of the memory device 100, the wordline power supply line 432 may be used both for supply VBLEQ to (or floating) a defective wordline 128 and supplying the activation voltage VPP to wordlines 128 which are not defective. Accordingly, the power supply connection circuitry including transistors 420, 422 may be switched according to the type of access taking place. As described above, if a given segment does not include a defective wordline 128, then the voltage of the wordline power supply line 432 may be maintained at the activation voltage VPP which may be used during activation of a wordline 128. If, however, a given segment does include a defective wordline 128, then the wordline power supply line 432 may be switched between VBLEQ and VPP as desired. For example, during precharge for a segment which includes a defective wordline 128, the voltage of the wordline power supply line 432 may be changed to VBLEQ using the power supply connection circuitry 420, 422. Then, during activation of a wordline 128, the voltage of the wordline power supply line 432 may be changed to the activation voltage VPP, allowing the activation voltage VPP to be provided to non-defective wordlines 128 when activated.

In one embodiment, during normal operation of the memory device 100, to provide sufficient time between precharge and activation of a wordline 128 for switching the wordline power supply line 432 from the precharge voltage VBLEQ to the activation voltage VPP, when an activation command is received and decoded by the command decoder 102, the voltage of the wordline power supply line 432 may be changed (if necessary) from VBLEQ to VPP using the power supply connection circuitry 420, 422. In one embodiment, the decoded activation command may be used directly to begin changing the voltage of the wordline power supply line 432 without using any decoding of the address for the activation command to initiate the switch.

In some cases, the bitline equalized voltage VBLEQ may not be applied to the wordline power supply line 432 during normal operation of the memory device 100. For example, in one embodiment, if a given wordline power supply line 432 is shared by multiple wordlines 128 and/or multiple segments of wordlines 128, and the wordlines 128 shared by the wordline power supply line 432 do not include a defective wordline, then the wordline power supply line voltage may be maintained at the activation voltage VPP and used by wordlines 128 being activated as appropriate for normal operations of the memory device 100.

Also, in one embodiment, when the memory device 100 is not being tested, the bitline equalized voltage VBLEQ may be applied to a wordline supply line 432 (even a wordline supply line 432 for a defective wordline 128) only when the memory device 100 is placed in a standby mode, including, for example, a low power standby mode and/or a self refresh mode. During standby mode, when a non-defective wordline 128 which shares the wordline power supply line 432 is activated, the wordline power supply line 432 may be switched from VBLEQ to VPP if needed for activation of the non-defective wordline 128. When the device 100 is not in standby mode, the activation voltage VPP may be applied to the wordline power supply line 432 without switching to another voltage. When a wordline 128 which is not defective and which shares the wordline power supply line 432 is activated, the wordline power supply line 432 may provide the activation voltage VPP to the activated wordline. Also, as described above, when an activation command is received for an address corresponding to a defective wordline 128, the wordline off voltage VNWLL may be applied to the defective wordline 128 while a redundant wordline 128 is activated instead. By applying VBLEQ to the wordline power supply line 432 during a standby mode while applying VPP during normal operation of the device 100 outside of a standby mode, the amount of switching current caused by switching the wordline power supply line 432 between VBLEQ and VPP may be reduced, thereby reducing power consumption of the memory device 100.

While described above with respect to applying certain voltages to a wordline power supply line 432, wordline 128, and bitline 130 during a test and performing comparisons with certain reference voltages, embodiments of the invention may be utilized with any appropriate voltages which provide distinguishable test results. In some cases, the testing may be performed by another device (e.g., a tester or a processor in communication with the memory device). Optionally, the memory device may perform the test itself, for example, using built-in self test circuitry (BIST circuitry) within the memory device. In some cases, the self test may be performed, for example, in response to a command received by the memory device or when a flag is set in a mode register of the memory device. Also, in some cases, the self-test may be performed each time the memory device is initialized, for example, after the memory device is powered on or after the memory device is reset.

Also, while described above with respect to replacing one defective wordline with a redundant wordline, embodiments of the invention may be utilized where any number of defective wordlines is replaced with any number of other, redundant wordlines. In some cases, a group of wordlines containing one or more defective wordlines may be replaced by a group of redundant wordlines. For example, as mentioned above, in some cases, embodiments of the invention may be utilized with a segmented wordline architecture containing one or more main wordlines and a plurality of local wordlines each accessed by a main wordline. Where a segmented wordline architecture is used, in some cases, a segment containing a defective wordline may be replaced with another segment, for example, by storing address information for the segments as previously described.

While the foregoing is directed to embodiments of the present invention, other and further embodiments of the invention may be devised without departing from the basic scope thereof, and the scope thereof is determined by the claims that follow.

What is claimed is:

1. A method for testing for a short between a wordline being tested and a bitline in a memory device, the method comprising:
    applying a first voltage to the bitline using a first voltage source;
    applying a second voltage to the wordline being tested using a second voltage source;
    disconnecting the wordline being tested from the second voltage source; and
    after disconnecting the wordline being tested from the second voltage source:
    activating the wordline being tested, thereby connecting the wordline being tested to a wordline power supply line; and
    determining whether a voltage of the wordline power supply line indicates a short between the wordline being tested and the bitline, the determining being based on the voltage of the wordline power supply line relative to the first voltage and the second voltage.

2. The method of claim 1, wherein determining whether a voltage of the wordline power supply line indicates a short between the wordline being tested and the bitline comprises:
    identifying the short upon determining that the voltage of the wordline power supply line is between a third voltage and the first voltage, wherein the third voltage is between the first voltage and the second voltage; and
    identifying the wordline being tested as functional upon determining that the voltage of the wordline power supply line is between the third voltage and the second voltage.

3. The method of claim 1, further comprising:
    upon determining that the voltage of the wordline power supply line indicates the short between the wordline being tested and the bitline, storing address information identifying an address of the wordline being tested.

4. The method of claim 3, further comprising:
    upon determining that the voltage of the wordline power supply line indicates the short between the wordline being tested and the bitline, identifying a redundant wordline to be used instead of the wordline being tested when an access is performed to an address of the wordline being tested.

5. The method of claim 3, further comprising:
    upon determining that the voltage of the wordline power supply line indicates the short between the wordline being tested and the bitline:
    during a subsequent precharge operation, applying a bitline equalized voltage to the bitline and the wordline being tested, wherein the second voltage is applied to at least one wordline other than the wordline being tested during the subsequent precharge operation.

6. The method of claim 5, wherein the bitline equalized voltage is applied to the wordline being tested during the subsequent precharge operation only when the memory device is placed in a standby mode, wherein the second voltage is applied to the wordline being tested when the memory device is not in the standby mode.

7. The method of claim 1, wherein the first voltage is a bitline high voltage and wherein the second voltage is a wordline off voltage.

8. A dynamic, random access memory device, comprising:
    a wordline;
    a wordline power supply line;
    a bitline; and
    circuitry configured to perform a test operation for a short between the wordline and the bitline, wherein, during the test operation, the circuitry is configured to:
    apply a first voltage to the bitline using a first voltage source;
    apply a second voltage to the wordline using a second voltage source;
    disconnect the wordline from the second voltage source; and
    after disconnecting the wordline from the second voltage source:
    activate the wordline, thereby connecting the wordline being tested to the wordline power supply line; and
    determine whether a voltage of the wordline power supply line indicates a short between the wordline and the bitline, the determining being based on the voltage of the wordline power supply line relative to the first voltage and the second voltage.

9. The memory device of claim 8, wherein determining whether a voltage of the wordline power supply line indicates a short between the wordline being tested and the bitline comprises:
    identifying the short upon determining that the voltage of the wordline power supply line is between a third voltage and the first voltage wherein the third voltage is between the first voltage and the second voltage; and
    identifying the wordline being tested as functional upon determining that the voltage of the wordline power supply line is between the third voltage and the second voltage.

10. The memory device of claim 8, wherein the circuitry, upon determining that the voltage of the wordline power supply line indicates the short between the wordline being tested and the bitline, is configured to store address information identifying an address of the wordline being tested.

11. The memory device of claim 10, wherein the circuitry, upon determining that the voltage of the wordline power supply line indicates the short between the wordline being tested and the bitline, is configured to identify a redundant wordline to be used instead of the wordline being tested when an access is performed to the address of the wordline being tested.

12. The memory device of claim 10, wherein the circuitry, upon determining that the voltage of the wordline power supply line indicates the short between the wordline being tested and the bitline, is configured to, during a subsequent precharge operation, apply a bitline equalized voltage to the bitline and the wordline being tested, wherein the second voltage is applied to at least one wordline other than the wordline being tested during the subsequent precharge operation.

13. The memory device of claim 12, wherein the bitline equalized voltage is applied to the wordline being tested during the subsequent precharge operation only when the memory device is placed in a standby mode, wherein the second voltage is applied to the wordline being tested when the memory device is not in the standby mode.

14. The memory device of claim 8, wherein the first voltage is a bitline high voltage and wherein the second voltage is a wordline off voltage.

15. A method for testing for a short between a wordline being tested and a bitline in a memory device, the method comprising:
  applying a first bitline voltage to the bitline using a first voltage source and a wordline off voltage to the wordline being tested using a second voltage source;
  applying a precharge voltage to a wordline power supply line using a third voltage source;
  disconnecting the wordline being tested from the second voltage source and disconnecting the wordline power supply line from the third voltage source; and
  after disconnecting the wordline being tested from the second voltage source and disconnecting the wordline power supply line from the third voltage source:
  connecting the wordline being tested to the wordline power supply line; and
  determining whether a voltage of the wordline power supply line indicates a short between the wordline being tested and the bitline, the determining being based on the voltage of the wordline power supply line relative to the first bitline voltage and the wordline off voltage.

16. The method of claim 15, further comprising:
  upon determining that the voltage of the wordline power supply line indicates a short between the wordline being tested and the bitline:
  during a subsequent precharge operation:
  applying a bitline equalized voltage to the bitline; and
  applying the bitline equalized voltage to the wordline power supply line and the wordline being tested, wherein the wordline off voltage is applied to at least one wordline other than the wordline being tested during the subsequent precharge operation.

17. The method of claim 16, wherein the bitline equalized voltage is applied to the wordline being tested during the subsequent precharge operation only when the memory device is placed in a standby mode, wherein the wordline off voltage is applied to the wordline being tested when the memory device is not in the standby mode.

18. The method of claim 16, further comprising:
  upon determining that the voltage of the wordline power supply line indicates a short between the wordline being tested and the bitline:
  during activation of a wordline other than the wordline being tested:
  applying a wordline activation voltage to the wordline power supply line; and
  applying the wordline activation voltage to the wordline other than the wordline being tested via the wordline power supply line.

19. The method of claim 16, wherein the bitline equalized voltage is applied to the wordline power supply line for the wordline being tested upon determining that the voltage of the wordline being tested indicates a short between the wordline being tested and the bitline, and wherein a wordline activation voltage is applied to at least one other wordline power supply line for other wordlines during the subsequent precharge operation.

20. A dynamic, random access memory device, comprising:
  a wordline;
  a wordline power supply line which is connectible to the wordline;
  a bitline; and
  circuitry configured to perform a test operation for a short between the wordline and the bitline, wherein, during the test operation, the circuitry is configured to:
  apply a first bitline voltage to the bitline using a first voltage source;
  apply a wordline off voltage to the wordline using a second voltage source;
  apply a precharge voltage to the wordline power supply line using a third voltage source;
  disconnect the wordline from the second voltage source and disconnect the wordline power supply line from the third voltage source; and
  after disconnecting the wordline from the second voltage source and disconnecting the wordline power supply line from the third voltage source:
  connect the wordline to the wordline power supply line; and
  determine whether a voltage of the wordline power supply line indicates a short between the wordline and the bitline, the determining being based on the voltage of the wordline power supply line relative to the first bitline voltage and the wordline off voltage.

21. The memory device of claim 20, wherein the circuitry, upon determining that the voltage of the wordline power supply line indicates a short between the wordline and the bitline is further configured to, during a subsequent precharge operation:
  apply the bitline equalized voltage to the bitline; and
  apply the bitline equalized voltage to the wordline power supply line and the wordline, wherein the circuitry is configured to apply the wordline off voltage to at least one wordline other than the wordline during the subsequent precharge operation.

22. The memory device of claim 21, wherein the circuitry is configured to apply the bitline equalized voltage to the wordline during the subsequent precharge operation only when the memory device is placed in a standby mode, wherein the wordline off voltage is applied to the wordline when the memory device is not in the standby mode.

23. The memory device of claim 21, wherein the circuitry, upon determining that the voltage of the wordline power supply line indicates a short between the wordline and the bitline and during activation of a wordline other than the wordline, is configured to:
  apply a wordline activation voltage to the wordline power supply line; and
  apply the wordline activation voltage to the wordline other than the wordline via the wordline power supply line.

24. The memory device of claim 21, wherein the circuitry is configured to apply the bitline equalized voltage to the wordline power supply line for the wordline upon determining that the voltage of the wordline indicates a short between the wordline and the bitline, and wherein the circuitry is configured to apply a wordline activation voltage to at least one other wordline power supply line for other wordlines during the subsequent precharge operation.

25. A dynamic, random access memory device, comprising:
   a wordline;
   a bitline;
   a wordline power supply line;
   power supply connection circuitry configured to connect the wordline power supply line to at least one of a precharge voltage and a wordline activation voltage;
   wordline connection circuitry configured to connect and disconnect the wordline from the wordline power supply line; and
   control circuitry configured to perform a test operation for a short between the wordline and the bitline, wherein, during the test operation, the control circuitry is configured to:
   apply a first bitline voltage to the bitline using a first voltage source;
   apply a wordline off voltage to the wordline using a wordline off voltage source;
   apply the precharge voltage to the wordline power supply line using the power supply connection circuitry;
   disconnect the wordline from the wordline off voltage source;
   disconnect the wordline power supply line from the precharge voltage using the power supply connection circuitry;
   connect the wordline to the wordline power supply line using the wordline connection circuitry; and
   after connecting the wordline to the wordline power supply line, determine whether a voltage of the wordline power supply line indicates a short between the wordline and the bitline, the determining being based on the voltage of the wordline power supply line relative to the first bitline voltage and the wordline off voltage.

26. The memory device of claim 25, further comprising:
   comparison circuitry configured to compare the voltage of the wordline power supply line to a reference voltage, wherein the control circuitry is configured to use the comparison circuitry to determine whether the voltage of the wordline indicates the short between the wordline and the bitline.

27. The memory device of claim 25, wherein the wordline is a local wordline in a segment comprising a plurality of local wordlines.

28. The memory device of claim 27, wherein the memory device comprises separate power supply connection circuitry for each wordline power supply line in each segment of the memory device.

29. The memory device of claim 27, wherein the power supply connection circuitry is shared by a plurality of segments including the segment comprising the plurality of local wordlines.

* * * * *